US012765219B2

(12) United States Patent
Huang et al.

(10) Patent No.: US 12,765,219 B2
(45) Date of Patent: Oct. 13, 2026

(54) COLOR FILM SUBSTRATE, DISPLAY PANEL, AND DISPLAY DEVICE

(71) Applicant: BOE Technology Group Co., Ltd., Beijing (CN)

(72) Inventors: Wei Huang, Beijing (CN); Qian Jin, Beijing (CN); Jinglu Bai, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 440 days.

(21) Appl. No.: 18/279,307

(22) PCT Filed: Nov. 11, 2022

(86) PCT No.: PCT/CN2022/131489
§ 371 (c)(1),
(2) Date: Aug. 29, 2023

(87) PCT Pub. No.: WO2024/098406
PCT Pub. Date: May 16, 2024

(65) Prior Publication Data
US 2025/0081799 A1 Mar. 6, 2025

(51) Int. Cl.
*H10K 59/50* (2023.01)
*G02F 1/155* (2006.01)
(Continued)

(52) U.S. Cl.
CPC ............. *H10K 59/50* (2023.02); *G02F 1/155* (2013.01); *G02F 1/157* (2013.01); *H10K 59/38* (2023.02); *G02F 2202/36* (2013.01)

(58) Field of Classification Search
CPC ................. G02B 5/30; G02F 1/133514; G02F 1/134345; H10K 59/50; H10K 59/38
See application file for complete search history.

(56) References Cited

U.S. PATENT DOCUMENTS

2017/0139266 A1* 5/2017 Yu ..................... G02F 1/133514
2017/0242292 A1 8/2017 Jeon et al.
(Continued)

FOREIGN PATENT DOCUMENTS

CN 102707510 * 10/2012 ............. G02F 1/133
CN 102707510 A 10/2012
(Continued)

OTHER PUBLICATIONS

English Translation of CN102707510 (Year: 2012).*
English Translation of CN114038881 (Year: 2022).*

*Primary Examiner* — Eric K Ashbahian
(74) *Attorney, Agent, or Firm* — IPro, PLLC

(57) ABSTRACT

A color film substrate, including: a first base substrate, a plurality of control electrodes, a fixed signal terminal, a color film layer, a drive circuit, and a first light-shielding layer. The color film layer includes a plurality of first color films, a plurality of second color films, and a plurality of color-changing color films. An orthographic projection of each of the first color films on the first base substrate is within one of first pixel regions. The first color film is in a first color. An orthographic projection of each of the second color films on the first base substrate is within one of second pixel regions. The second color film is in a second color. Each of the color-changing color films is configured to regulate a color based on the second color and a third color under control of the fixed signal terminal and the drive circuit.

17 Claims, 14 Drawing Sheets

(51) Int. Cl.
*G02F 1/157* (2006.01)
*H10K 59/38* (2023.01)

(56) References Cited

U.S. PATENT DOCUMENTS

| | | | |
|---|---|---|---|
| 2019/0025634 | A1 | 1/2019 | Park et al. |
| 2021/0351239 | A1* | 11/2021 | Bae ...................... H10K 59/879 |
| 2022/0091445 | A1 | 3/2022 | Yoon et al. |
| 2022/0214591 | A1* | 7/2022 | Van Der Boom ........ E06B 9/24 |
| 2022/0291780 | A1* | 9/2022 | Kim ...................... G06F 3/0412 |
| 2023/0163142 | A1 | 5/2023 | Lu et al. |
| 2024/0168353 | A1* | 5/2024 | Zhang .................... H10K 59/50 |

FOREIGN PATENT DOCUMENTS

| | | | | |
|---|---|---|---|---|
| CN | 104777663 | A | 7/2015 | |
| CN | 109283750 | A | 1/2019 | |
| CN | 111373544 | A | 7/2020 | |
| CN | 111627951 | A | 9/2020 | |
| CN | 112002744 | A | 11/2020 | |
| CN | 114038881 | * | 2/2022 | ............... G02B 5/30 |
| CN | 114038881 | A | 2/2022 | |
| CN | 114256305 | A | 3/2022 | |
| WO | 2019099833 | A1 | 5/2019 | |

* cited by examiner

COLOR FILM SUBSTRATE, DISPLAY PANEL, AND DISPLAY DEVICE

CROSS-REFERENCE TO RELATED APPLICATION

The present disclosure is a U.S. national stage of international application No. PCT/CN2022/131489, filed on Nov. 11, 2022, the content of which is herein incorporated by reference in its entirety.

TECHNICAL FIELD

The present disclosure relates to the field of display technologies, and in particular, relates to a color film substrate, a display panel, and a display device.

BACKGROUND

Quantum dot organic light-emitting diode (QD-OLED) display panels are gradually becoming competitors to OLEDs due to their advantages of high photochromic purity, high luminescence quantum efficiency, and easy regulation of luminescence colors.

SUMMARY

Embodiments of the present disclosure provide a color film substrate, a display panel, and a display device. The technical solutions are as follows.

According to some embodiments of the present disclosure, a color film substrate is provided.

The color film substrate includes:

- a first base substrate, including a plurality of first pixel regions, a plurality of second pixel regions, a plurality of third pixel regions, and a light-shielding region;
- a plurality of control electrodes disposed on the first base substrate, wherein each of the control electrodes is within one of the third pixel regions;
- a fixed signal terminal, connected to the plurality of control electrodes;
- a color film layer disposed on the first base substrate, including at least a plurality of first color films, a plurality of second color films, and a plurality of color-changing color films, wherein an orthographic projection of each of the first color films on the first base substrate is within one of the first pixel regions, the first color film is in a first color, an orthographic projection of each of the second color films on the first base substrate is within one of the second pixel regions, the second color film is in a second color, and an orthographic projection of each of the color-changing color films on the first base substrate is within one of the third pixel regions;
- a drive circuit, connected to the plurality of color-changing color films, wherein each of the color-changing color films is configured to regulate a color based on the second color and a third color under control of the fixed signal terminal and the drive circuit; and
- a first light-shielding layer, disposed on the first base substrate, wherein an orthographic projection of the first light-shielding layer on the first base substrate is within the light-shielding region.

In some embodiments, the first base substrate further includes a plurality of fourth pixel regions, and the color film layer further includes a plurality of third color films, wherein an orthographic projection of each of the third color films on the first base substrate is within one of the fourth pixel regions, and the third color film is in the third color.

In some embodiments, a ratio of an area of the color-changing color film to a sum of areas of the color-changing color film and the third color film is positively correlated to a ratio of a peak energy of light of the third color to a peak energy of light of the second color in light emitted by the light-emitting unit in the array substrate of the display panel.

In some embodiments, the first base substrate includes a plurality of buffer empty pool regions in one-to-one correspondence with the plurality of third pixel regions, and a communication hole is disposed in the first light-shielding layer between each of the buffer empty pool regions and a corresponding one of the third pixel regions; and the color-changing color film is acquired by curing a color-changing fluidic material, wherein prior to the curing, the color-changing fluidic material filled into each of the third pixel regions enters a corresponding one of the buffer empty pool regions through the communication hole; and upon the curing, the color-changing color film is within the third pixel region and the buffer empty pool region that are communicated.

In some embodiments, each n buffer empty pool regions corresponding to each n third pixel regions of the plurality of third pixel regions are within a target region, each of the target regions being between two of the n third pixel regions; and a ratio of a sum of areas S2 of the n buffer empty pool regions to an area S1 of one of the third pixel regions satisfies: $S2/S1 \geq n(H1/H2-1)$; wherein H1 represents a thickness of the color-changing fluid material in a case that the color-changing fluid material is filled only into the third pixel region, and H2 represents a thickness of the color-changing fluid material in a case that the color-changing fluid material is filled into both the third pixel region and the buffer empty pool region.

In some embodiments, n is equal to 2, the target region is between two third pixel regions, each of the buffer empty pool regions is semicircular, straight edges of the two buffer empty pool regions within one of the target regions are opposite to each other, and the first light-shielding layer is disposed between the straight edges of the two buffer empty pool regions.

In some embodiments, n is equal to 6, six third pixel regions are arranged in three rows and two columns, the target region is between two of the third pixel regions in a second row, each of the buffer empty pool regions is equilateral triangle-shaped, vertex angles of the six buffer empty pool regions within one of the target regions are opposite to each other, and the first light-shielding layer is disposed between any two of the buffer empty pool regions.

In some embodiments, the color-changing color film is acquired by curing an electrochemical gel solution; and the color film substrate further includes: a plurality of first signal lines, wherein one end of each of the first signal lines is connected to one of the color-changing color films and the other end is connected to the drive circuit, the drive circuit supplies a first signal to the color-changing color film by the first signal line, and the first signals supplied by the drive circuit to different color-changing color films have different potentials; and a plurality of second signal lines, wherein one end of each of the second signal lines is connected to one of the control electrodes and the other end is connected to the fixed signal terminal, the fixed signal terminal supplies a second signal to the control electrode by the second signal line, and the second signals supplied by the fixed signal terminal to different control electrode have an equal potential; wherein the color-changing color film is configured to regulate the color based on the second color and the third color under control of an electric field formed by a voltage difference between the first signal and the second signal.

In some embodiments, the color-changing color film is acquired by curing a temperature gel solution; and the color film substrate further includes: a plurality of first signal lines, wherein one end of each of the first signal lines is connected to one of the color-changing color films and the other end is connected to the drive circuit, the drive circuit supplies a first signal to the color-changing color film by the first signal line, and the first signals supplied by the drive circuit to different color-changing color films have different potentials; and a plurality of second signal lines, wherein one end of each of the second signal lines is connected to one of the control electrodes and the other end is connected to the fixed signal terminal, one end of the first signal line is further connected to one end of the second signal line, and the first signal supplied by the drive circuit for the color-changing color film is released to the fixed signal terminal by the second signal line; wherein a temperature of the control electrode is positively correlated with a magnitude of a current of the signal transmitted over the first signal line and the second signal line, and the color-changing color film is configured to regulate the color based on the second color and the third color under control of the temperature of the control electrode.

In some embodiments, the drive circuit includes a first drive sub-circuit, a second drive sub-circuit, and a transistor device layer disposed on the first base substrate, the transistor device layer including a plurality of drive transistors; wherein each of the drive transistors includes a control electrode, a first electrode, and a second electrode; wherein the control electrode is connected to the first drive sub-circuit and configured to turn on or turn off under control of the first drive sub-circuit, the first electrode is connected to the second drive sub-circuit and configured to receive a signal transmitted by the second drive sub-circuit, and the second electrode is connected to one of the color-changing color films and configured to supply, in response to the control electrode being turned on, the signal transmitted to one of the color-changing color films; or the drive circuit is a drive chip, wherein the drive chip is connected to the plurality of color-changing color films and configured to supply signals to the plurality of color-changing color films.

In some embodiments, the color film substrate further includes: a first color-converting layer, a second color-converting layer, a light-transmitting layer, and a second light-shielding layer; wherein the first color-converting layer includes a first quantum dot, wherein the first quantum dot is excited based on light of the third color to emit light of the first color; the second color-converting layer includes a second quantum dot, wherein the second quantum dot is excited based on light of the third color to emit light of the second color; the light-transmitting layer is configured to transmit light of the third color; and an orthographic projection of the second light-shielding layer on the first base substrate is within the light-shielding region.

In some embodiments, the first color is red, the second color is green, and the third color is blue.

According to some embodiments of the present disclosure, a display panel is provided. The display panel includes: an array substrate, and the color film substrate as described above; wherein the array substrate includes a plurality of light-emitting units, light emitted from each of the light-emitting units being exited upon passing through the color film substrate.

In some embodiments, the array substrate and the color film substrate are opposite to form a cell; or the color film substrate is prepared directly on a side of the array substrate.

According to some embodiments of the present disclosure, a display device is provided. The display device includes a power supply assembly and the display panel as described above; wherein the power supply assembly is configured to power the display panel.

BRIEF DESCRIPTION OF DRAWINGS

For clearer descriptions of the technical solutions in the embodiments of the present disclosure, the following briefly introduces the accompanying drawings to be required in the descriptions of the embodiments. Apparently, the accompanying drawings in the following description show merely some embodiments of the present disclosure, and persons of ordinary skills in the art may still derive other drawings from these accompanying drawings without creative efforts.

DETAILED DESCRIPTION

The present disclosure is described in further detail with reference to the accompanying drawings, to clearly present the objects, technical solutions, and advantages of the present disclosure.

In some practices, a QD-OLED display panel includes red sub-pixels, green sub-pixels, and blue sub-pixels. Blue light emitted from the blue sub-pixel is exited independently by a blue OLED device. Red light emitted by the red pixel exits after the blue light emitted by the blue OLED is converted by a red quantum dot. Green light emitted by the green pixel exits after the blue light emitted by the blue OLED is converted by a green quantum dot.

However, due to the high sensitivity of human eyes to green light and a low conversion rate of the green quantum dot for blue light, it is easy to lead to low luminance of green light exited by the display panel and a poor display effect of the display panel.

With the continuous development and advancement of display technology, it is important for a display device to present a maximum range of natural colors and bring people more realistic and shocking visual experiences. In a wide color gamut, quantum dot display devices have unique advantages in the display field of a narrow luminescence spectrum and high color purity. The current luminescence method of the quantum dot display device includes photoluminescence and electroluminescence.

Quantum dot color filters (QDCF) have been widely studied as photoluminescent quantum dot display devices in recent years. The QDCF is equipped with a blue light-emitting device, such that light emitted from the blue light-emitting device achieves a full-color display after passing through a color-converting layer composed of quantum dots and then passing through a red color film or a green color film, which has good development prospects. The light-emitting device is a light-emitting diode (LED), an organic light-emitting diode (OLED), or a micro LED.

The integration of the quantum dot display device is mainly to oppositely arrange a color film substrate and an array substrate to form a cell, which maximizes the compatibility of the current factory equipment layout and capacity utilization. Alternatively, the color film substrate is directly formed on the array substrate (i.e., a QDCF On EL structure), which reduces a thickness of the device and facilitates flexibility.

Figure 1:
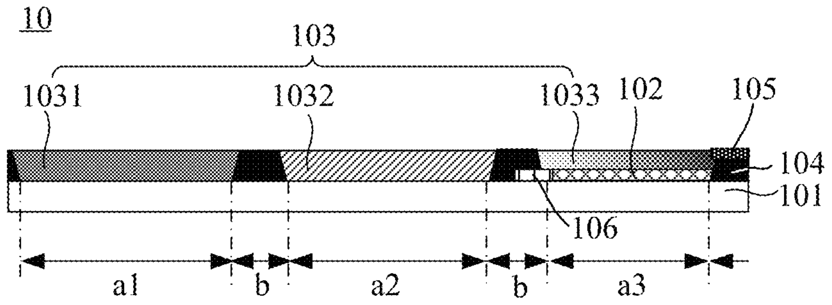
FIG. 1 is a schematic structural diagram of a color film substrate according to some embodiments of the present disclosure.

FIG. 1 is a schematic structural diagram of a color film substrate according to some embodiments of the present disclosure. Referring to FIG. 1, the color film substrate 10 includes a first base substrate 101, a plurality of control electrodes 102, a fixed signal terminal (not illustrated in FIG. 1), a color film (CF) layer 103, a drive circuit (not illustrated in FIG. 1), and a first light-shielding layer 104.

The first base substrate 101 includes a plurality of first pixel regions a1, a plurality of second pixel regions a2, a plurality of third pixel regions a3, and a light-shielding region b. The light-shielding region b is between any adjacent two pixel regions for separating the pixel regions.

The plurality of control electrodes 102 are disposed on the first base substrate 101, and the plurality of control electrodes 102 and the plurality of third pixel regions a3 are in one-to-one correspondence, wherein each of the control electrodes 102 is within the corresponding third pixel region a3. The fixed signal terminal is connected to the plurality of control electrodes 102, which is configured to supply second signals with the same potential to the plurality of control electrodes 1021 or to release first signals transmitted in the plurality of control electrodes 102.

The color film layer 103 is disposed on the first base substrate 101, and the color film layer 103 includes at least a plurality of first color films 1031, a plurality of second color films 1032, and a plurality of color-changing color films 103. The plurality of first color films 1031 and the plurality of first pixel regions a1 are in one-to-one correspondence, and an orthographic projection of each of the first color films 1031 on the first base substrate 101 is within the corresponding first pixel region a1. The plurality of second color films 1032 and the plurality of second pixel regions a2 are in one-to-one correspondence, and an orthographic projection of each of the second color films 1032 on the first base substrate 101 is within the corresponding second pixel region a2. The first color film 1031 is in a first color, such that the first pixel region a1 corresponding to the first color film 1031 displays the first color. The second color film 1032 is in a second color, such that the second pixel region a2 corresponding to the second color film 1032 displays the second color.

The plurality of color-changing color films 1033 and the plurality of third pixel regions a3 are in one-to-one correspondence, and an orthographic projection of each of the color-changing color films 1033 on the first base substrate 101 is within the corresponding third pixel region a3. The drive circuit is connected to the plurality of color-changing color films 103. Each of the color-changing color films 1033 is configured to regulate, under the control of the fixed signal terminal and the drive circuit, a color based on the second color and the third color. In some embodiments, the color-changing color film 1033 is in a mixed color of the second color and the third color. A color ratio of the second color to the third color in the mixed color of the color-changing color film 1033 is regulated by the fixed signal terminal and the drive circuit. The third pixel region a3 is referred to as a color-changing pixel region.

The first light-shielding layer 104 is disposed on the first base substrate 101, and an orthographic projection of the first light-shielding layer 104 on the first base substrate 101 is within the light-shielding region b. The first light-shielding layer 104 is configured to block light. That is, the light is not able to be exited from the light-shielding region b where the first light-shielding layer 104 is disposed but only from the pixel regions.

In some embodiments, in the case that the color displayed in the third pixel region a3 needs to be biased towards the second color, the fixed signal terminal and the drive circuit are caused to regulate the color-changing color film 1033 to increase a color ratio of the second color in the mixed color of the color-changing color film 1033 and to decrease a color ratio of the third color in the mixed color. Alternatively, in the case that the color displayed in the third pixel region a3 needs to be biased towards the third color, the fixed signal terminal and the drive circuit are caused to regulate the color-changing color film 1033 to decrease the color ratio of the second color in the mixed color of the color-changing color film 1033 and to increase the color ratio of the third color in the mixed color. As a result, in the case that the luminance of the second color displayed by the second pixel region a2 of the display panel is low, the luminance of the second color displayed by the display panel is increased by regulating the color ratio of the second color in the color-changing color film 1033, such that a display effect of the display panel is ensured.

In summary, some embodiments of the present disclosure provide a color film substrate. The color-changing color film in the color film layer of the color film substrate is capable of regulating the color based on the second color and the third color under the control of the fixed signal terminal and the drive circuit. In this way, in the case that the luminance of the second color displayed by the second pixel region of the display panel is low, the luminance of the second color displayed by the display panel is increased by regulating the color ratio of the second color in the color-changing color film, such that the display effect of the display panel is ensured.

In some embodiments, the first color is red (R), the second color is green (G), and the third color is blue (B). Accordingly, the color-changing color film 1033 is caused to regulate the color based on green and blue under the control of the fixed signal terminal and the drive circuit. Further, in the case that the luminance of the green color displayed by the second pixel region a2 of the display panel is low, the luminance of the green color displayed by the display panel is increased by regulating the color ratio of the green color in the color-changing color film 1033, such that the display effect of the display panel is ensured.

That is, compared with some practices, the color film substrate 10 according to some embodiments of the present disclosure is capable of selectively increasing a pixel aperture ratio of a green image, such that the color substrate has a high electrical-optical efficiency, and a power consumption of the display device is further reduced.

Figure 2:
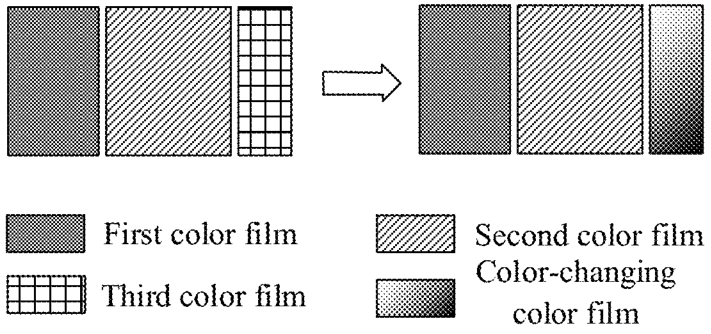
FIG. 2 is a partial schematic diagram of a color film layer according to some embodiments of the present disclosure.
Figure 3:
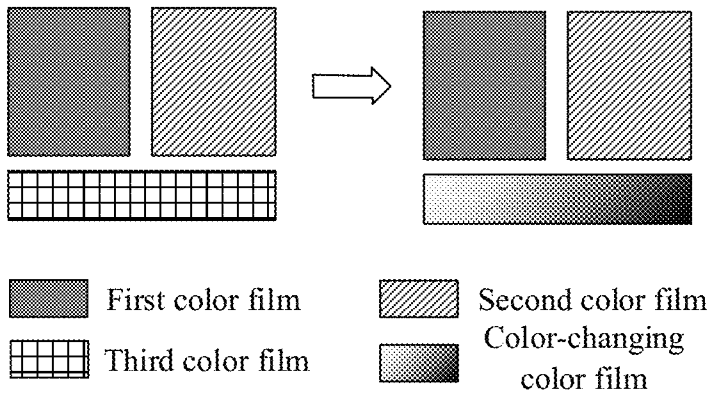
FIG. 3 is a partial schematic diagram of another color film layer according to some embodiments of the present disclosure.

In some embodiments, referring to FIG. 2 and FIG. 3, all of the third color pixel regions in some practices are changed to color-changing pixel regions (i.e., the third pixel regions a3). Accordingly, the display of the third color is achieved by the color-changing pixel region, and the color-changing pixel region also achieves the display of the second color.

In this implementation, the color of the light emitted from the light-emitting unit in the array substrate is constant, and the entire color-changing color film is used 100% to display the second color (e.g., green). Therefore, the color film substrate is used preferentially in a monochromatic display scenario of an image of the second color, and thus the advantage of high luminance is highlighted.

Figure 4:
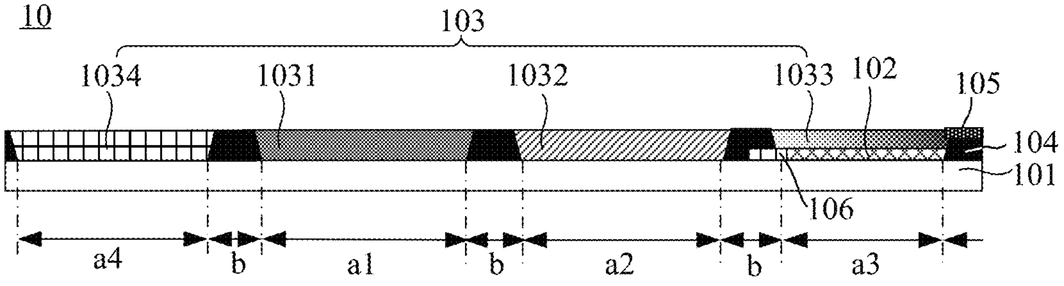
FIG. 4 is a schematic structural diagram of another color film substrate according to some embodiments of the present disclosure.

FIG. 4 is a schematic structural diagram of another color film substrate according to some embodiments of the present disclosure. Referring to FIG. 4, the first base substrate 101 further includes a plurality of fourth pixel regions a4. The color film layer 103 further includes a plurality of third color films 1034. The plurality of third color films 1034 and the plurality of fourth pixel regions a4 are in one-to-one correspondence. An orthographic projection of each of the third color films 1034 on the first base substrate 101 is within the corresponding fourth pixel region a4. The third color film 1034 is in a third color. Accordingly, the fourth pixel region a4 corresponding to the third color film 1034 displays the third color.

That is, in some embodiments, the display of the third color is achieved only by the third pixel region a3 corresponding to the color-changing color film 1033 (as the technical solution illustrated in FIG. 1). Alternatively, the display of the third color is achieved by the third pixel region a3 corresponding to the color-changing color film 1033 and the fourth pixel region a4 corresponding to the third color film 1034 (as the technical solution illustrated in FIG. 2).

In the case that the color film layer 103 includes the color-changing color film 1033 and the third color film 1034, an area of the color-changing color film 1033 has a proportional relation with the sum of areas of the color-changing color film 1033 and the third color film 1034 (i.e., a ratio of the area of the color-changing color film 1033 to the sum of the areas of the color-changing color film 1033 and the third color film 1034). By regulating the proportional relation, white points are balanced and the color film substrate is employed for multi-color images of white/green/blue (W/G/B).

In some embodiments, the relation between the area of the color-changing color film 1033 and the sum of the areas of the color-changing color film 1033 and the third color film 1034 satisfies:

a B-peak area ratio of a spectrum of the color-changing color film×a B-peak energy ratio of a light source×(the area of the third color film+the area of the color-changing color film)=K (constant)×a G-peak area ratio of the spectrum of the color-changing color film×a G-peak energy ratio of the light source×the area of the color-changing color film.

That is, the ratio of the area of the color-changing color film 1033 to the sum of the areas of the color-changing color film 1033 and the third color film 1034 satisfies:

the area of the color-changing color film/(the area of the third color film+the area of the color-changing color film)=(the B-peak area ratio of the spectrum of the color-changing color film×the B-peak energy ratio of the light source)/(K (constant)×the G-peak area ratio of the spectrum of the color-changing color film×the G-peak energy ratio of the light source).

As a result, the ratio of the area of the color-changing color film 1033 to the sum of the areas of the color-changing color film 1033 and the third color film 1034 is positively correlated to the ratio of the peak energy of the light of the third color to the peak energy of the light of the second color in the light emitted from the light-emitting unit in the array substrate of the display panel. The larger the ratio of the peak energy of the light of the third color to the peak energy of the light of the second color in the light emitted from the light-emitting unit, the larger the ratio of the area of the color-changing color film 1033 to the sum of the areas of the color-changing color film 1033 and the third color film 1034, that is, the color-changing pixel region is larger; and the smaller the ratio of the peak energy of the light of the third color to the peak energy of the light of the second color in the light emitted from the light-emitting unit, the smaller the ratio of the area of the color-changing color film 1033 to the sum of the areas of the color-changing color film 1033 and the third color film 1034, that is, the color-changing pixel region is smaller. The value of K ranges from 0.05 to 0.5, in some embodiments, from 0.1 to 0.

Figure 5:
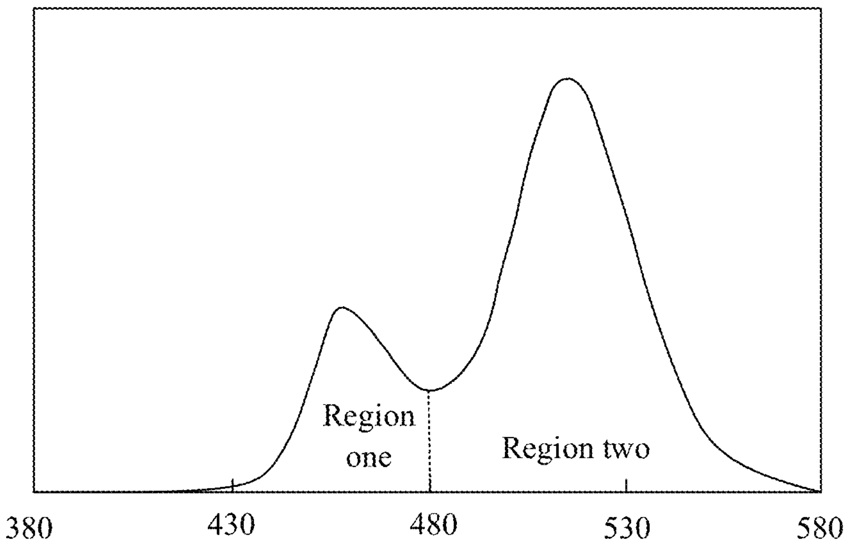
FIG. 5 is a curve diagram of a relation between transmittance and wavelength of a color-changing color film according to some embodiments of the present disclosure.
Figure 6:
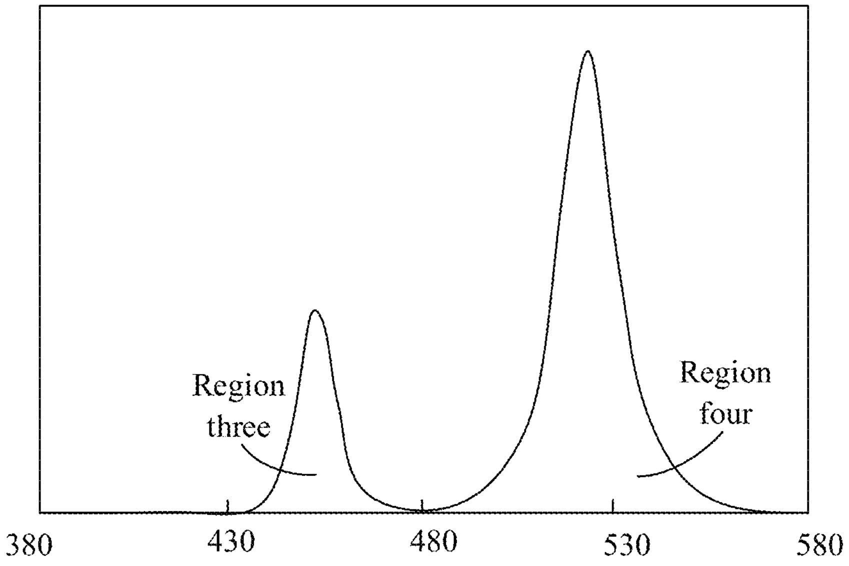
FIG. 6 is a curve diagram of a relation between luminous intensity and wavelength of a light source according to some embodiments of the present disclosure.

It should be noted that the spectrum refers to an optical transmittance spectrum of the color-changing color film 103. Referring to FIG. 5, the horizontal coordinate represents the wavelength and the vertical coordinate represents the transmittance. The B-peak area ratio of the spectrum of the color-changing color film refers to a ratio of an area of a region between a portion of the transmittance curve, where the color-changing color film transmits B-light, and the horizontal axis to a total area of a region between a portion of the transmittance curve, where the color-changing color film transmits B-light and G-light, and the horizontal axis, i.e., an area of a region one/(the sum of areas of the region one and a region two). The G-peak area ratio of the spectrum of the color-changing color film refers to a ratio of an area of a region between a portion of the transmittance curve, where the color-changing color film transmits G-light, and the horizontal axis to the total area of the region between the portion of the transmittance curve, where the color-changing color film transmits B-light and G-light, and the horizontal axis, i.e., an area of the region two/(the sum of the areas of the region one and the region two). Referring to FIG. 6, the horizontal coordinate represents the wavelength and the vertical coordinate represents the luminous intensity. The B-peak energy ratio refers to a ratio of an area of a region between an intensity curve of B-light in an intensity curve of the light source and the horizontal axis to a total area of a region between intensity curves of B-light and G-light and the horizontal axis, i.e., an area of a region three/(the sum of areas of the region three and a region four). The G-peak energy ratio refers to a ratio of an area of a region between an intensity curve of G-light in the intensity curve of the light source and the horizontal axis to the total area of the region between the intensity curves of B-light and G-light and the horizontal axis, i.e., an area of the region four/(the sum of the areas of the region three and the region four).

Figure 7:
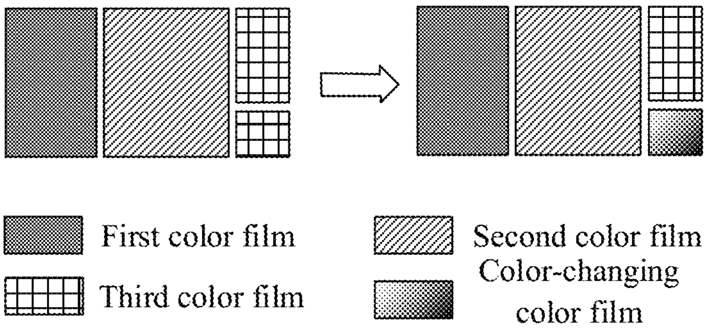
FIG. 7 is a partial schematic diagram of still another color film layer according to some embodiments of the present disclosure.

In some embodiments, in FIG. 7, the ratio of the area of the color-changing color film 1033 to the sum of the areas of the color-changing color film 1033 and the third color film 1034 is 2/5. That is, the area of the color-changing color film 1033 is 40% of the sum of the areas of the color-changing color film 1033 and the third color film 1034. In this case, the area of the third color film 1034 is greater than the area of the color-changing color film 1033. Alternatively, in FIG. 8, the ratio of the area of the color-changing color film 1033 to the sum of the areas of the color-changing color film 1033 and the third color film 1034 is 1/2. That is, the area of the color-changing color film 1033 is 50% of the sum of the areas of the color-changing color film 1033 and the third color film 1034. In this case, the area of the color-changing color film 1033 is equal to the area of the third color film 1034.

Figure 8:
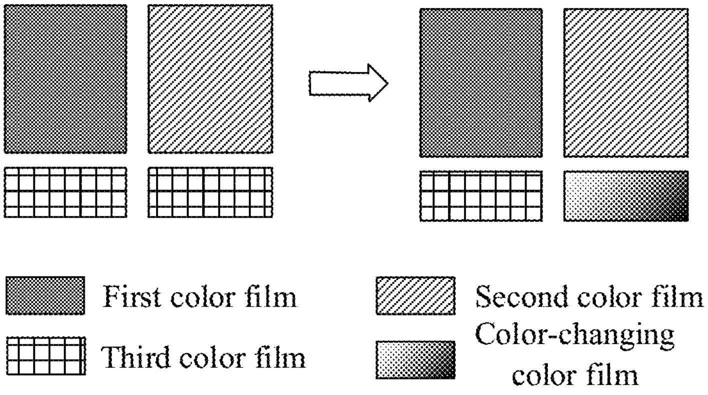
FIG. 8 is a partial schematic diagram of yet still another color film layer according to some embodiments of the present disclosure.

In some embodiments, the pixels of the color film substrate illustrated in FIG. 2 and FIG. 7 are arranged in a REAL pattern. The pixels of the color film substrate illustrated in FIG. 3 and FIG. 8 are arranged in a "delta shape" pattern.

Figure 9:
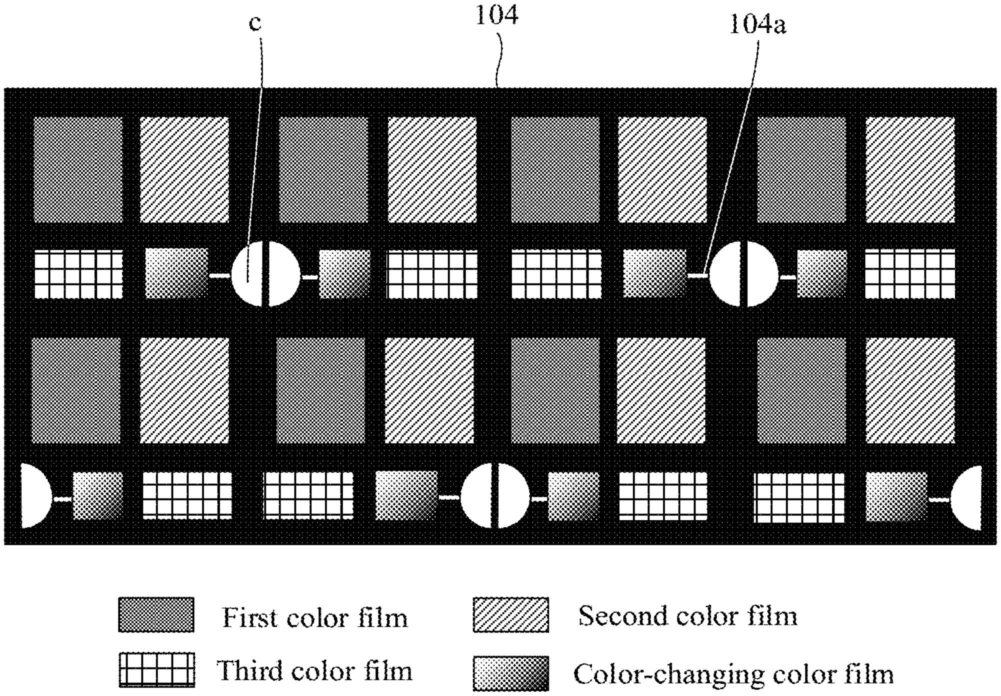
FIG. 9 is a top view of a color film layer and a first light-shielding layer according to some embodiments of the present disclosure.

FIG. 9 is a top view of a color film layer and a first light-shielding layer according to some embodiments of the present disclosure. Referring to FIG. 9, the first base substrate 101 further includes a plurality of buffer empty pool regions c in one-to-one correspondence with the plurality of third pixel regions a3. A communication hole 104*a* is disposed in the first light-shielding layer 104 between each of the buffer empty pool regions c and the corresponding third pixel region a3.

The color-changing color film 1033 is acquired by curing a color-changing fluidic material. Prior to the curing, the color-changing fluid material filled into each of the third pixel regions a3 enters a corresponding buffer empty pool region c through the communication hole 104*a*. After the curing, the color-changing color film 1033 is within the third pixel region a3 and the buffer empty pool region c that are communicated.

Figure 10:
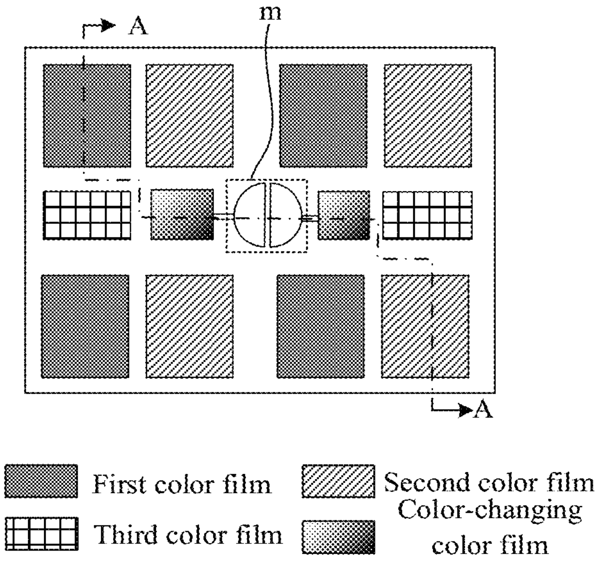
FIG. 10 is a top view of another color film layer and another first light-shielding layer according to some embodiments of the present disclosure.
Figure 11:
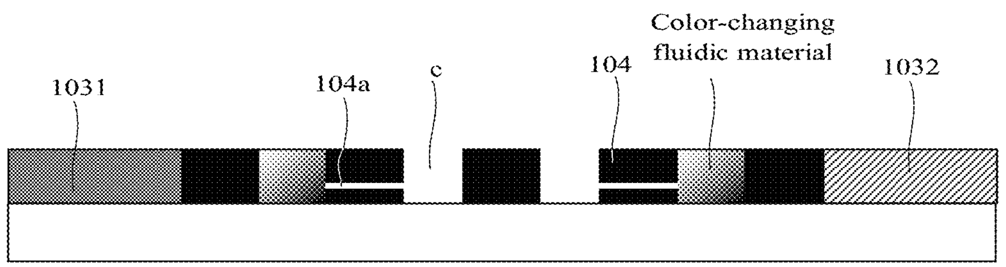
FIG. 11 is a preset schematic structural diagram of FIG. 10 along a direction AA.
Figure 12:
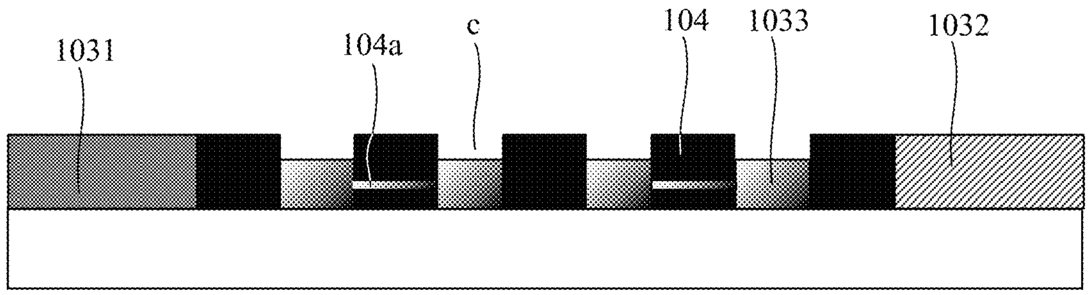
FIG. 12 is an actual schematic structural diagram of FIG. 10 along a direction AA.

In the embodiments, by designing the buffer empty pool region c, a fluid buffer region is provided for the color-changing fluidic material during forming the color-changing color film 1033, such that a deposition process window of the color-changing fluidic material is increased, and thus the control to the thickness of the color-changing color film 1033 is achieved. In conjunction with FIG. 10 to FIG. 12, in the case that the color-changing fluid material has flowed from the third pixel region a3 to the buffer empty pool region c, the color-changing fluid material occupies a large region, and thus a thickness of the color-changing fluid material is appropriately reduced. That is, with a fixed volume, a bottom area increases as a height decreases. For ease of illustration, the first light-shielding layer in FIG. 10 is not illustrated with a black fill. FIG. 11 is a preset schematic structural diagram, indicating that the color-changing fluid material is filled only up to the third pixel region. FIG. 12 is an actual schematic structural diagram, indicating that the color-changing fluid material flows through the communication hole 104*a* to the buffer empty pool region c.

In some embodiments, each n buffer empty pool regions c corresponding to each n third pixel regions a3 of the plurality of third pixel regions a3 are within a target region m, and each of the target regions m is between two of the n third pixel regions a3. A ratio of the sum of areas S2 of the n buffer empty pool regions c to an area S1 of one third pixel region a3 satisfies:

$$S2/S1 \geq n(H1/H2-1) \quad \text{Equation (1)}$$

H1 represents a thickness of the color-changing fluid material in the case that the color-changing fluid material is filled only into the third pixel region a3. H2 represents a thickness of the color-changing fluid material in the case that the color-changing fluid material is filled into both the third pixel region a3 and the buffer empty pool region c. H1 is generally equal to a height of the first light-shielding layer 104 (e.g., BM and bank). H2 is correlated to a process feature linewidth of gel patterning in pixel design space. In the case that the gel patterning uses a printing process, the process feature linewidth ranges from 30 μm (microns) to 60 μm, which represents a width of the third pixel region a3. S1 is determined based on the ratio of the area of the color-changing color film 1033 to the sum of the areas of the color-changing color film 1033 and the third color film 1034. Thus, S2 is determined based on equation (1).

Equation (1) is derived according to the following manner. In the case that the color-changing fluid material is filled only into the third pixel region a3, some color-changing fluid material overflows from the first light-shielding layer 104.

After the color-changing fluid material flows from the third pixel region a3 to the buffer empty pool region c through the communication hole 104*a*, the overflowed color-changing fluid material likewise flows through the communication hole 104*a*. As a result, a total volume of the color-changing fluid material (including the overflowed portion) in the case that the color-changing fluid material is filled into both the third pixel region a3 and the buffer empty pool region c is greater than a total volume of the color-changing fluid material in the case that the color-changing fluid material is filled only into the third pixel region a3 (not including the overflowed portion). That is, the following equation is satisfied.

$$H2*\left(\frac{S2}{n}+S1\right)\geq H1*S1 \qquad \text{Equation (2)}$$

Equation (1) is derived from equation (2).

As an optional implementation, referring to FIG. 10, n is equal to 2. That is, equation (1) is $S2/S1 \geq 2(H1/H2-1)$. The target region m is between two third pixel regions a3, and each of the buffer empty pool regions c is semicircular. Straight edges of two buffer empty pool regions c within one target region m are opposite to each other, and the first light-shielding layer 104 is between the straight edges of the two buffer empty pool regions c. In some embodiments, in the case that n is equal to 2, $S2/S1 \geq 0.5$.

In some embodiments, in the case that the color-changing color film 1033 is processed using a photolithography process, an aperture of the buffer empty pool region ranges from 0 μm to 10 μm. The aperture of 0 μm for the buffer empty pool region indicates that there is no need to design the buffer empty pool region. In the case that the color-changing color film color 1033 is processed using an inkjet printing process, the aperture of the buffer empty pool region ranges from 30 μm to 100 μm.

Figure 13:
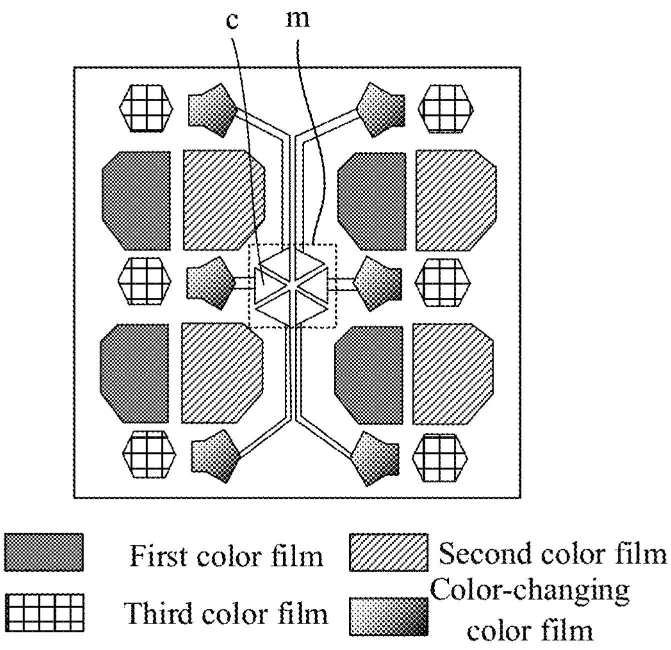
FIG. 13 is a top view of still another color film layer and still another first light-shielding layer according to some embodiments of the present disclosure.

As another optional implementation, referring to FIG. 13, n is equal to 6. That is, equation (1) is $S2/S1 \geq 6(H1/H2-1)$.

Figure 14:
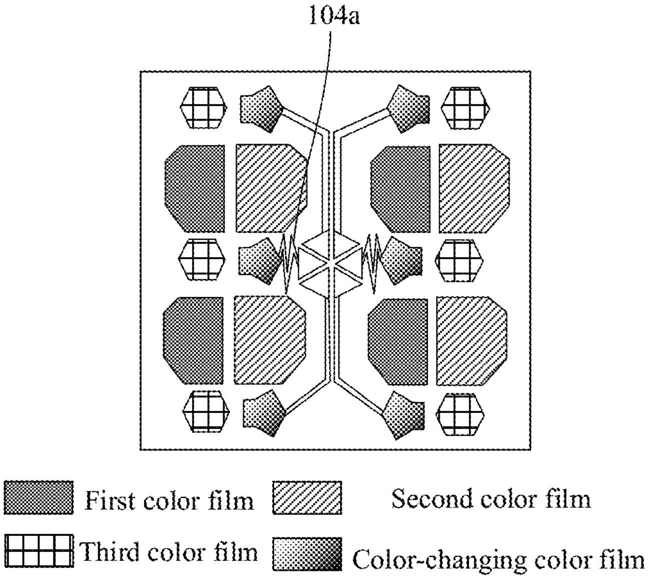
FIG. 14 is a top view of yet still another color film layer and yet still another first light-shielding layer according to some embodiments of the present disclosure.

In some embodiments, referring to FIG. 13, a distance between the first row of third pixel regions a3 and the corresponding buffer empty pool regions c, and a distance between the third row of third pixel regions a3 and the corresponding buffer empty pool regions c are large, while a distance between the second row of third pixel regions a3 and the corresponding buffer empty pool regions c is small, and thus a length of the communication hole 104 in the first light-shielding layer 104, which is configured to connect the first row (or the third row) of third pixel regions a3 to the corresponding buffer empty pool regions c is greater than a length of the communication hole 104*a* configured to connect the second row of third pixel regions a3 to the corresponding buffer empty pool regions c. As a result, the color-changing color films 1033 ultimately formed by the third pixel regions a3 have different thicknesses. To address this problem, referring to FIG. 14, the communication hole 104*a* between the second row of third pixel regions a3 and the corresponding buffer empty pool regions c is Z-shaped, such that the plurality of communications holes 104*a* have the same length, and thus the thicknesses of different color-changing color films 1033 are ensured to be equal.

It should be noted that the area of the target region is reduced by designing rational shapes for the plurality of buffer empty pool regions, such that more space to be visited by the layout is provided for the design of sub-pixels.

In some embodiments, the color-changing color film 1033 is acquired by curing an electrochemical gel solution. In some embodiments, the electrochemical gel solution is a single molecule leucine derivative, which is an electrochromic material.

The color-changing color film 1033 prepared by the electrochemical gel solution is capable of changing colors under different electric fields. In some embodiments, the electric field ranges from −30 volts (V) to 30 V. Use an electrochemical redox reaction of Equation (3) as an example.

Equation (3)

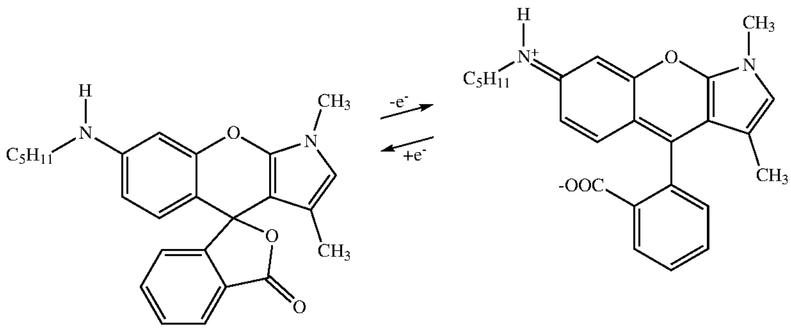

Six third pixel regions a3 are arranged in three rows and two columns, and the target region m is between two third pixel regions a3 in the second row. Each of the buffer empty pool regions c is equilateral triangle-shaped. Vertex angles of the six buffer empty pool regions c within one target region m are opposite to each other, and the first light-shielding layer 104 is disposed between any adjacent two of the six buffer empty pool regions c. In some embodiments, in the case that n is equal to 6, $S2/S1 \geq 1.5$. For ease of illustration, the first light-shielding layer in FIG. 13 is not illustrated with a black fill.

According to equation (3), the color-changing color film 1033 loses electrons (-e-) under the presence of the electric field, such that the carboxylic acid alicyclic hydrocarbon opens up, the COO ester group becomes negatively charged, the amyl amine group becomes positively charged, and the overall molecular configuration changes, such that electro-fluorochromism occurs to the color-changing color film 1033.

In this implementation, the color film substrate 10 further includes a plurality of first signal lines 105 and a plurality of second signal lines 106. One end of each of the first signal lines 105 is connected to one of the color-changing color films 1033, and the other end is connected to the drive circuit. The drive circuit supplies a first signal to the color-changing color film 1033 by the first signal line 105, and the first signals supplied by the drive circuit to different color-changing color films 1033 have different potentials. One end of each of the second signal lines 106 is connected to one of the control electrodes 102, and the other end is connected to the fixed signal terminal. The fixed signal terminal supplies a second signal to the control electrode 102 by the second signal line 106, and the second signals supplied by the fixed signal terminal to different control electrodes 102 have the same potential.

Accordingly, due to differences in the potentials of the first signals of the color-changing color films 1033, voltage differences between the first signals and the second signals in regions where different color-changing color films 1033 are disposed are different. Further, electric fields formed by the voltage differences in the regions where different color-changing color films 1033 are disposed have different intensity, such that the color-changing color films 1033 undergo different degrees of redox reaction, and thus the color-changing color films 1033 regulate the color based on the different degrees of redox reaction.

In some embodiments, the color-changing color film 1033 is acquired by curing a temperature gel solution. In some embodiments, the temperature gel solution is a poly (N-isopropylacrylamide) gel doped with highly charged elastic nanoparticles. The highly charged elastic nanoparticles contain hydrophobic elastic shells and the charge loading is achieved by doping with sodium p-styrenesulfonate. Cores of the nanoparticles are acquired by chemical synthesis, and the chemical material is an acrylate or methacrylate derivative, including but not limited to methyl methacrylate, n-butyl acrylate, or ethylene glycol dimethacrylate. The temperature gel solution prepares the pattern by 3D printing.

Figure 15:
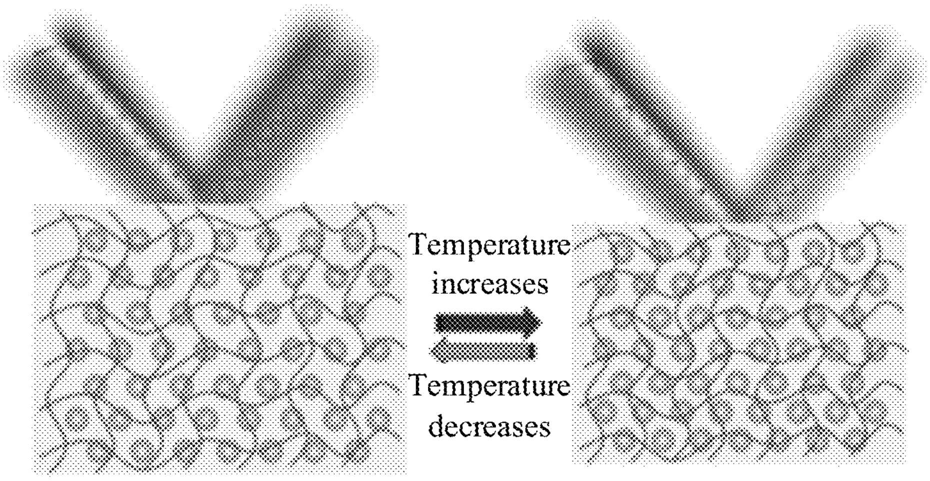
FIG. 15 is a schematic diagram of a color-changing color film when temperature increases and decreases according to some embodiments of the present disclosure.
Figure 16:
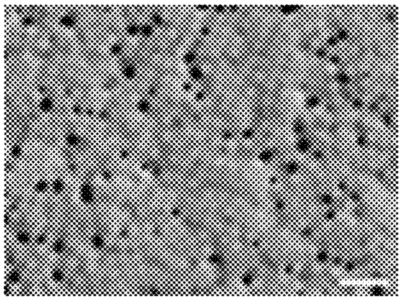
FIG. 16 is a surface electron microscope diagram of a color-changing color film according to some embodiments of the present disclosure.
Figure 17:
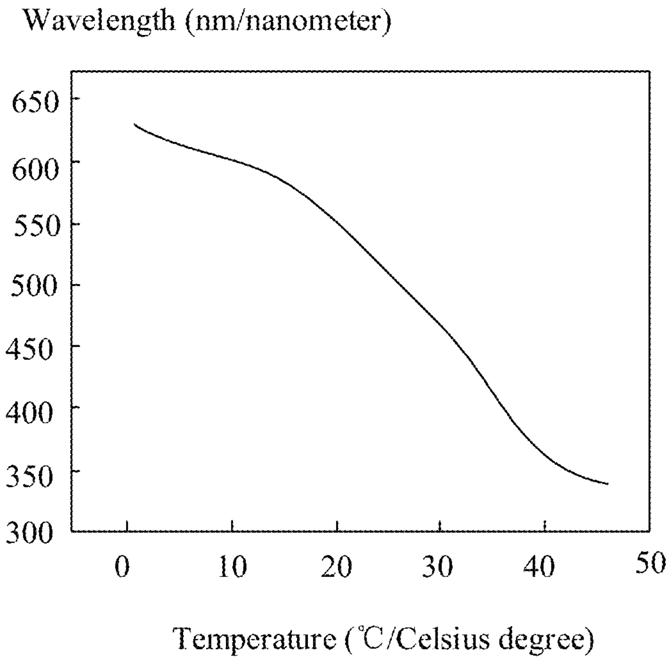
FIG. 17 is a schematic diagram of a relation between wavelength and temperature according to some embodiments of the present disclosure.

The color-changing color film 1033 prepared by the temperature gel solution changes the color in response to different temperatures. Referring to FIG. 15 to FIG. 17, in the case that the temperature increases, a spacing between substances in the color-changing color film 1033 decreases, a wavelength corresponding to the color decreases, and the color biases blue-violet. In the case that the temperature decreases, the spacing between the substances in the color-changing color film 1033 increases, the wavelength corresponding to the color increases, and the color biases red. In some embodiments, the temperature ranges from room temperature to 50° C. (Celsius degree).

In this implementation, the color film substrate 10 further includes a plurality of first signal lines 105 and a plurality of second signal lines 106. One end of each of the first signal lines 105 is connected to one of the color-changing color films 1033, and the other end is connected to the drive circuit. The drive circuit supplies a first signal to the color-changing color film 1033 by the first signal line 105, and the first signals supplied by the drive circuit to different color-changing color films 1033 have different potentials. One end of each of the second signal lines 106 is connected to one of the control electrodes 102 and the other end is connected to the fixed signal terminal. One end of the first signal line 105 is also connected to one end of the second signal line 106. The first signal supplied by the drive circuit to the color-changing color film 1033 is released to the fixed signal terminal by the second signal line 106.

Accordingly, due to differences in the potentials of the first signals of the color-changing color films 1033, magnitudes of currents of the control electrodes 102 in regions where different color-changing color films 1033 are disposed are different, such that the color-changing color films 1033 have different temperatures (the larger the current, the higher the temperature; the smaller the current, the lower the temperature). Further, different color-changing color films 1033 are capable of regulating the color based on different temperatures.

In some embodiments, the control electrode 102 is made of a transparent conductive material, such as indium tin oxide (ITO). The first signal line 105 and the second signal line 106 are made of metal materials conventional in the flat panel display (FPD) industry, such as copper (Cu), molybdenum (Mo), or aluminum (Al). The height of the light-shielding layer 104 ranges from 10 μm to 20 μm.

In some embodiments, the drive circuit includes a first drive sub-circuit, a second drive sub-circuit, and a transistor device layer disposed on the first base substrate 101. The transistor device layer includes a plurality of drive transistors. In some embodiments, the drive transistors are thin film transistors (TFT). Each of the drive transistors includes a control electrode, a first electrode, and a second electrode. The control electrode is connected to the first drive sub-circuit, and the control electrode is configured to turn on or turn off under the control of the first drive sub-circuit. The first electrode is connected to the second drive sub-circuit, and the first electrode is configured to receive a signal transmitted by the second drive sub-circuit. The second electrode is connected to one of the color-changing color films 1033, and the second electrode is configured to supply, in response to the control electrode being turned on, the signal transmitted from the second drive sub-circuit to the color-changing color film 103. The second electrode is connected to the color-changing color film 1033 by the first signal line 105, and the signal transmitted by the second drive sub-circuit is the first signal.

In some embodiments, the drive circuit is a drive chip. The drive chip is connected to the plurality of color-changing color films 1033 and configured to supply signals to the plurality of color-changing color films 1033. In some embodiments, the drive chip is connected to the color-changing color film 1033 by the first signal line 105.

Figure 18:
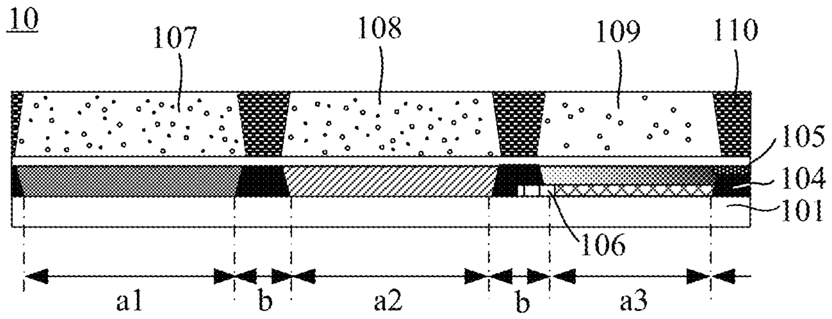
FIG. 18 is a schematic structural diagram of still another color film substrate according to some embodiments of the present disclosure.

FIG. 18 is a schematic structural diagram of still another color film substrate according to some embodiments of the present disclosure. Referring to FIG. 18, the color film substrate 10 further includes a first color-converting layer 107, a second color-converting layer 108, a light-transmitting layer 109, and a second light-shielding layer 110. The first color-converting layer 107 includes a first quantum dot that is excited based on light of the third color to emit light of the first color. The second color-converting layer 108 includes a second quantum dot that is excited based on light of the third color to emit light of the second color. The light-transmitting layer 109 is configured to transmit light of the third color. An orthographic projection of the second light-shielding layer 110 on the first base substrate 101 is within the light-shielding region b, i.e., between any two of the first color-converting layer 107, the second color-converting layer 108, and the light-transmitting layer 109.

In summary, some embodiments of the present disclosure provide a color film substrate. The color-changing color film in the color film layer of the color film substrate is capable of regulating the color based on the second color and the third color under the control of the fixed signal terminal and the drive circuit. In this way, in the case that the luminance of the second color displayed by the second pixel region of the display panel is low, the luminance of the second color displayed by the display panel is improved by regulating the color ratio of the second color in the color-changing color film, such that the display effect of the display panel is ensured.

Figure 19:
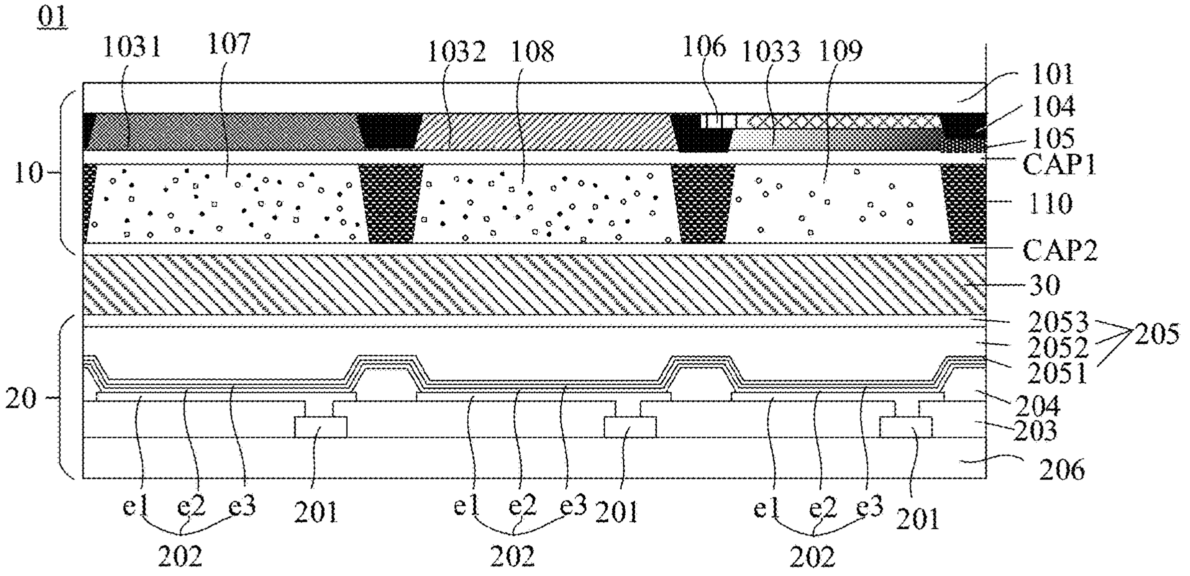
FIG. 19 is a schematic structural diagram of a display panel according to some embodiments of the present disclosure.

FIG. 19 is a schematic structural diagram of a display panel according to some embodiments of the present disclosure. Referring to FIG. 19, the display panel includes an array substrate 20 and the color film substrate 10 as described above. The array substrate 20 includes a plurality of light-emitting transistors 201 and a plurality of light-emitting units 202. The light-emitting transistor 201 is configured to drive the light-emitting unit 202 to emit light, and light emitted from each of the light-emitting units 202 is exited after passing through the color film substrate 10.

In some embodiments, each of the light-emitting units in the array substrate 20 emits blue light. Each of the light-emitting units includes at least one light-emitting device. In some embodiments, the light-emitting device is a light-emitting diode (LED) or an organic light-emitting diode (OLED).

In the case that the light-emitting device is an OLED, a top-emitting blue OLED device is typically employed, and the light-emitting unit is designed with a plurality of OLED devices stacked in series, such that an electro-optical efficiency is higher and a lifetime is longer. In some embodiments, a stack of two blue OLEDs (i.e., 2 stacks of BB), a stack of three blue OLEDs (i.e., 3 stacks of BBB), or a stack of four blue OLEDs (i.e., 4 stacks of BBBB). The greater the number of stacks, the better the electro-optical efficiency and lifetime.

In some embodiments, based on the sensitivity of the human eye to green light, for a better light-emitting efficiency of green light, the color of the light emitted by the light-emitting unit is a mixture of blue and green. That is, the light-emitting unit includes a light-emitting device emitting blue light and a light-emitting device emitting green light.

In some embodiments, the light-emitting unit is a stacked structure of a plurality of blue OLEDs and one green OLED, such that the color of the light emitted by the light-emitting unit in the array substrate is a mixture of blue and green. In some embodiments, a stack of three blue OLEDs and one green OLED (i.e., 4 stacks of BBBG) is employed. Compared to the structure of BBBB, the structure of BBBG reduces the voltage (e.g., the voltage is reduced by 30% in simulation results) and improves the luminance of green light (the degree of improvement is 30%).

In some embodiments, a wavelength of blue light ranges from 440 nm (nanometers) to 470 nm, and a wavelength of green light ranges from 520 nm to 540 nm. In the case that the color-changing color film 1033 of the color film substrate 10 is blue, the color-changing color film 1033 covers a center position of 450 nm (i.e., light with the wavelength of 450 nm is allowed to be transmitted), and a half peak width ranges from 20 nm to 40 nm. In the case that the color-changing color film 1033 of the color film substrate is green, the color-changing color film 1033 covers a center position of 530 nm (i.e., light with the wavelength of 530 nm is allowed to be transmitted), and the half peak width ranges from 20 nm to 40 nm.

Figure 20:
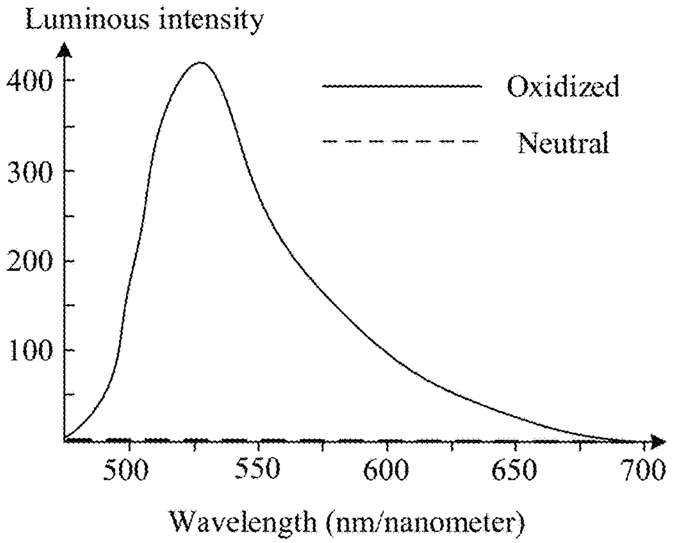
FIG. 20 is a schematic diagram of a relation between luminous intensity and wavelength according to some embodiments of the present disclosure.

Under the prerequisite that the light-emitting unit is a stacked structure of a plurality of blue OLEDs and one green OLED, and the color-changing color film 1033 changes the color under the action of an electric field, referring to FIG. 20, in the case that excitation intensity of the light-emitting unit in the array substrate 20 is 0, the light-emitting unit does not emit light, and the color-changing color film 1033 is not oxidized (neutrally) by electrical excitation; and in the case that the excitation intensity of the light-emitting unit in the array substrate is not 0, the light-emitting unit emits light, and an electrochemical gel is oxidized by electrical excitation, such that the color-changing color film 1033 changes the color (is oxidized). Moreover, the color of the light emitted by the light-emitting unit changes to colors of different wavelengths with different excitation light units. The wavelength ranges from 450 nm to 700 nm. The same excitation intensity corresponds to two different wavelengths, indicating that the light is mixed light of colors corresponding to the two wavelengths.

In some embodiments, the array substrate 20 and the color film substrate 10 of the display panel 01 are acquired by cell alignment. Alternatively, the color film substrate 10 is acquired by being directly prepared on a side of the array substrate 10.

Referring to FIG. 19, in the case that the array substrate 20 and the color film substrate 10 of the display panel 01 are cell aligned, a filler layer 30 is disposed between the array substrate 20 and the color film substrate 10, which is configured to fill a breakage difference of the array substrate 20 or the color film substrate 10.

In this implementation, the control electrode 102 is distal from the array substrate 20 relative to the color-changing color film 1033, the first signal line 105 is disposed on a side, distal from the first base substrate 101, of the first light-shielding layer 104, and the second signal line 106 is disposed on a side, proximal to the first base substrate 101, of the first light-shielding layer 104. The first signal line 105 is connected to the color-changing color film 1033 through a via in the first light-shielding layer 104. The second signal line 106 is directly connected to the control electrode 102.

Figure 21:
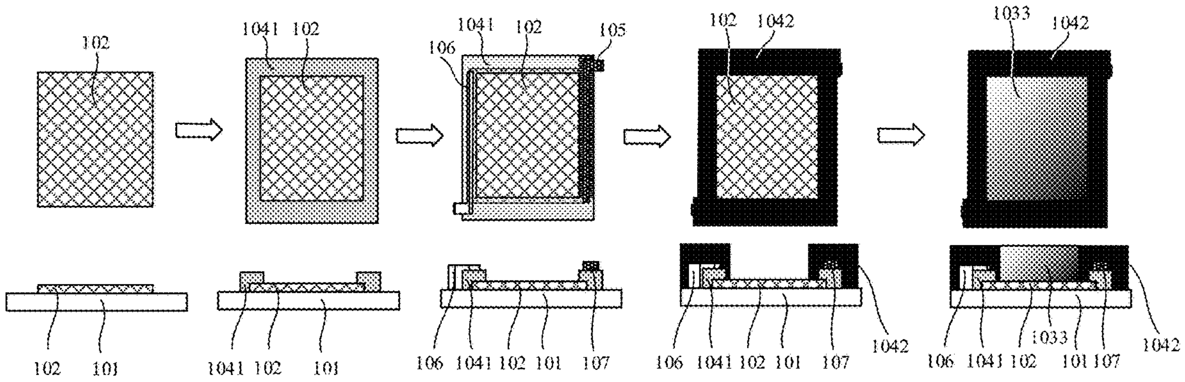
FIG. 21 is a schematic diagram of a preparation process for forming a color-changing color film according to some embodiments of the present disclosure.

In some embodiments, the first signal line 105 and the second signal line 106 are prepared together. Referring to FIG. 21, the first light-shielding layer 104 includes a first sub-light-shielding layer 1041 and a second sub-light-shielding layer 1042. The preparation process includes: forming the control electrode 102 on a side of the first base substrate 101; forming the first sub-light-shielding layer 1041 on a side, distal from the first base substrate 101, of the control electrode 102, wherein the first sub-light-shielding layer 1041 covers a boundary of the control electrode 102 and exposes a middle region of the control electrode 102; forming the first signal line 105 and the second signal line 106 on a side, distal from the first base substrate 101, of the first sub-light-shielding layer 1041, wherein the second signal line 106 is connected to the control electrode 102 through a via in the first sub-light shieling layer 1041; forming the second sub-light-shielding layer 1042 on a side, distal from the first base substrate 101, of the first signal line 105 and the second signal line 106, wherein the second sub-light-shielding layer 1042 and the first sub-light-shielding layer 1041 together form the third pixel region a3 defining the color-changing color film 1033; and acquiring the color-changing color film 1033 by filling the third pixel region a3 with a color-changing fluid material and curing the color-changing fluid material. The first sub-light-shielding layer 1041 is referred to as a black matrix (BM) and the second sub-light-shielding layer 1042 is referred to as a bank.

Figure 22:
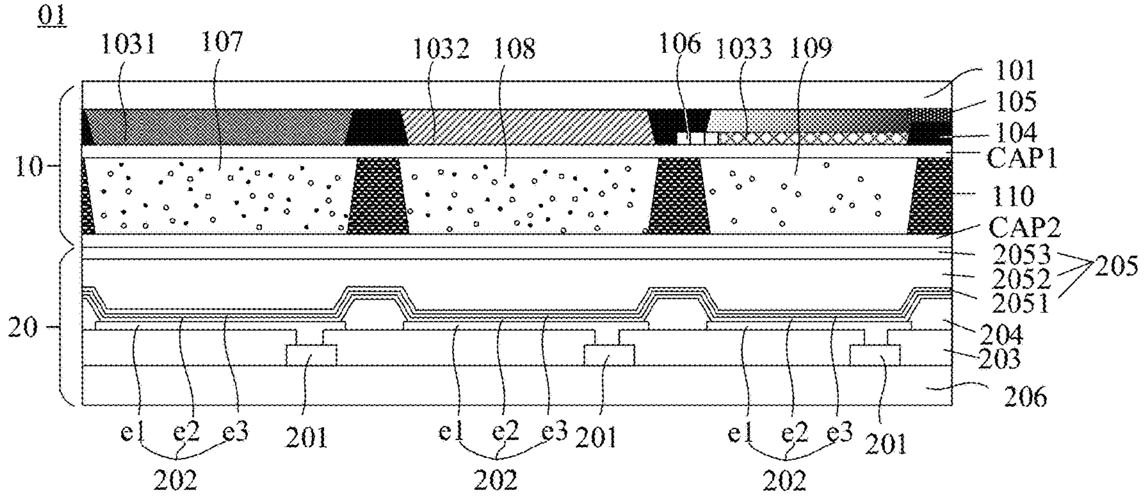
FIG. 22 is a schematic structural diagram of another display panel according to some embodiments of the present disclosure.

Referring to FIG. 22, in the case that the color film substrate 10 of the display panel is prepared directly on a side of the array substrate 10, the filler layer is not provided between the array substrate 20 and the color film substrate 10.

In this implementation, the control electrode 102 is proximal to the array substrate 20 relative to the color-changing color film 1033, the first signal line 105 is disposed on a side, distal from the first base substrate 101, of the first light-shielding layer 104, and the second signal line 106 is disposed on a side, proximal to the first base substrate 101, of the first light-shielding layer 104. The first signal line 105 is connected to the color-changing color film 1033 through a via in the first light-shielding layer 104. The second signal line 106 is directly connected to the control electrode 102. Alternatively, the first signal line 105 and the second signal line 106 are prepared together. For the preparation process, reference is made to the preparation process of cell alignment described above, which is not repeated herein.

In the implementation of cell alignment, the array substrate 20 includes a second base substrate 206, a light-emitting transistor 201 disposed on the second base substrate 206, and a plurality of light-emitting units 202. In the case that the drive transistor of the drive circuit and the light-emitting transistor 201 are prepared together on the array substrate 20, the drive transistor of the drive circuit is too far from the color-changing color film 1033 and the first signal line 105 in the color film substrate 10 to achieve the transmission of signals. Therefore, the drive transistor of the drive circuit needs to be designed on the first base substrate 101 of the color film substrate 10. In the implementation of cell alignment, the first base substrate 101 is configured to prepare the drive transistor of the drive circuit. The drive circuit includes a first drive sub-circuit, a second drive sub-circuit, and a transistor device layer. The drive transistor is disposed in the transistor device layer. Alternatively, the drive circuit in this implementation is a drive chip.

In the implementation of direct preparation, the array substrate 20 and the color film substrate 10 are formed on the same base substrate, such as the first base substrate 101. The plurality of light-emitting transistors 201 and the plurality of light-emitting units 202 are first prepared on the first base substrate 101, and then the color film layer 103 in the color film substrate 10 is prepared. In the case that the drive transistor of the drive circuit and the light-emitting transistor 201 are prepared together on the array substrate 20, the drive transistor of the drive circuit is too far from the color-changing color film 1033 and the first signal line 105 in the color film substrate 10 to achieve the transmission of signals. However, a base substrate for carrying the drive transistor of the drive circuit is not provided in this implementation, such that the drive circuit in the implementation is a drive chip.

Referring to FIG. 19 and FIG. 22, the array substrate 20 includes a planarization layer 203, a pixel-defining layer 204, and an encapsulation film layer 205 in addition to the light-emitting transistor 201 and the light-emitting unit 202 disposed on the base substrate (the first base substrate 101 or the second base substrate). The planarization layer 203 is between the light-emitting transistor 201 and the light-emitting unit 202, and the light-emitting unit 202 and the light-emitting transistor 201 are connected to each other through a via in the planarization layer 203.

The encapsulation film layer 205 is disposed on a side, distal from the base substrate, of the light-emitting unit 202 and configured to encapsulate the light-emitting unit 202. The encapsulation film layer 205 includes a first film layer 2051, a second film layer 2052, and a third film layer 2053 that are successively stacked. In some embodiments, the first film layer 2051 and the third film layer 2053 are made of an inorganic material, and the second film layer 2052 is made of an organic material. In some embodiments, the first film layer 2051 and the third film layer 2053 are made of one or more inorganic oxides such as silicon nitride ($SiN_X$), silicon oxide ($SiO_X$), and silicon oxynitride ($SiO_XN_Y$). The second film layer 2052 is made of a resin material. The resin is a thermoplastic resin or a thermoset resin, wherein the thermoplastic resin includes an acrylic (PMMA) resin, and the thermoset resin includes an epoxy resin.

In some embodiments, the second film layer 2052 is prepared by using an inkjet printing (IJP) method. The first film layer 2051 and the third film layer 2053 are prepared by using a chemical vapor deposition (CVD) method.

The light-emitting device in the light-emitting unit 202 includes an anode layer e1, an emissive layer e2, and a cathode layer e3. The anode layers e1 of the plurality of light-emitting units 202 are spaced apart, and the plurality of light-emitting units 202 share the cathode layer e3. The anode layer e1 of the light-emitting unit 202 is connected to the light-emitting transistor 201 through the via in the planarization layer 20 The light-emitting unit 202 in the figures includes only one light-emitting device.

Referring to FIG. 19 and FIG. 22, the display panel further includes inorganic film layers (CAP1 and CAP2). The inorganic film layer is made of an inorganic material such as silicon nitride, silicon oxide, silicon oxynitride, or aluminum oxide.

Figure 23:
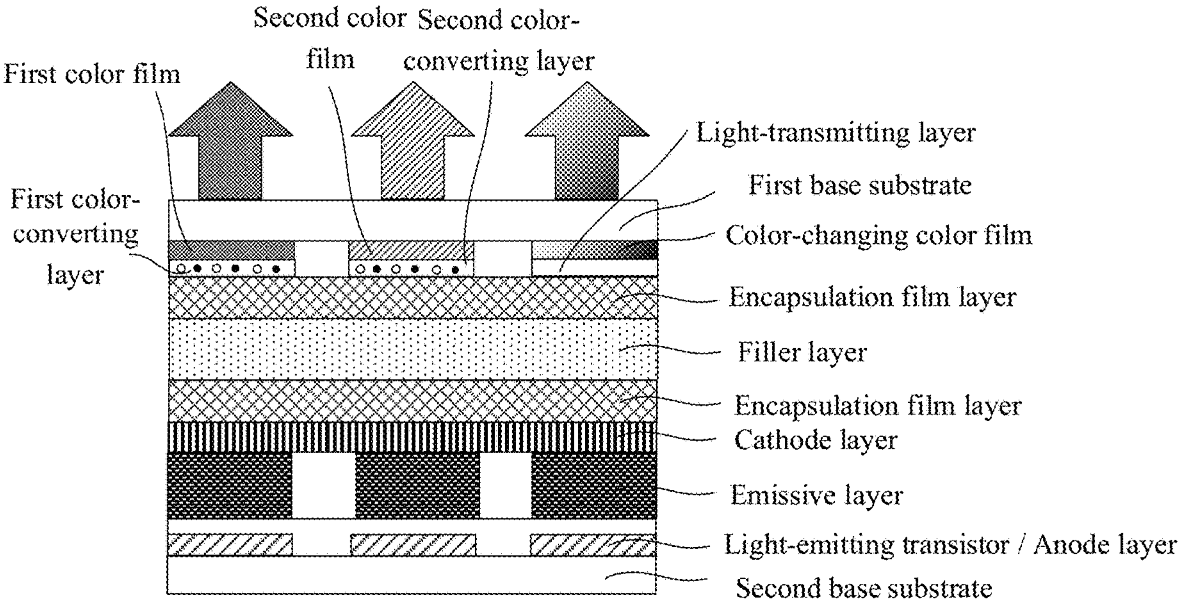
FIG. 23 is a schematic structural diagram of still another display panel according to some embodiments of the present disclosure.

In some embodiments, referring to FIG. 23, the display panel is a quantum dot display panel of a common structure. Alternatively, referring to FIG. 24, the display panel is a quantum dot display panel of a beam-limiting structure. Alternatively, referring to FIG. 25, the display panel is a quantum dot display panel of a beam-limiting micro-focus structure.

The beam-limiting structure is a black resin material for absorbing or shielding excitation light with a large angle. The micro-focus structure is a resin material of high refractive index nanoparticles for regulating a propagation angle of light.

Figure 24:
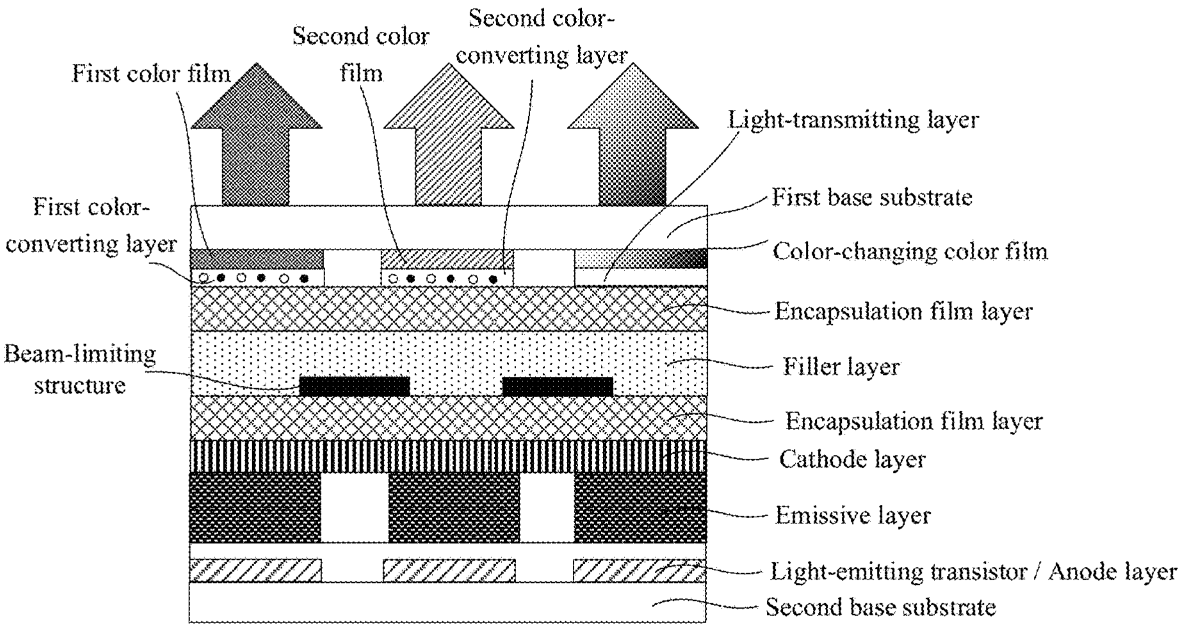
FIG. 24 is a schematic structural diagram of yet still another display panel according to some embodiments of the present disclosure.
Figure 25:
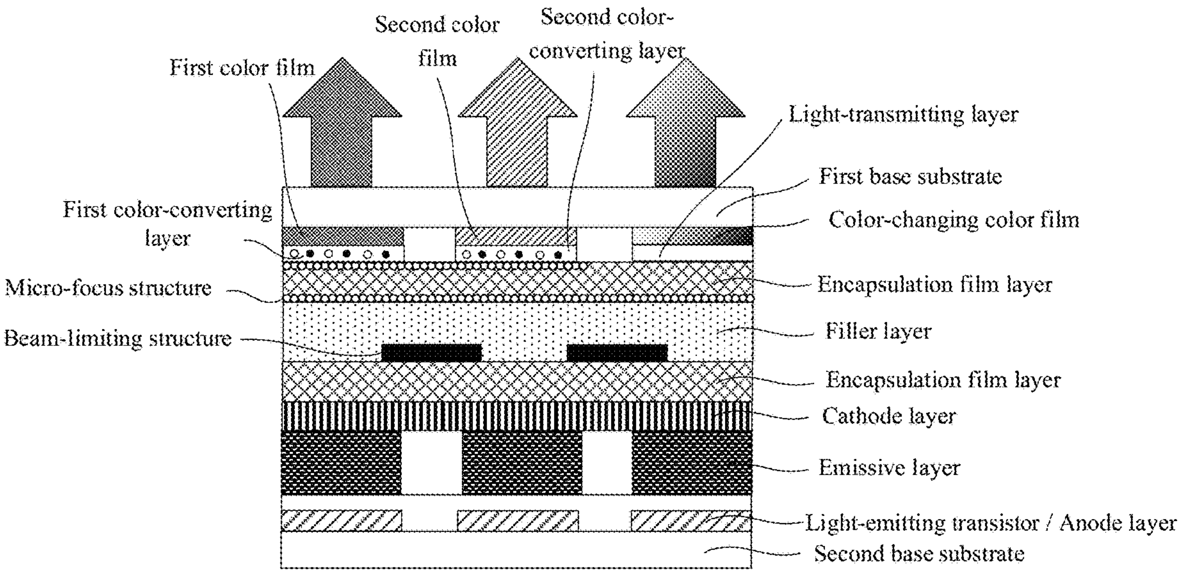
FIG. 25 is a schematic structural diagram of yet still another display panel according to some embodiments of the present disclosure.

Two encapsulation film layers are illustrated in FIG. 23 to FIG. 25, the encapsulation film layer proximal to the first base substrate is configured to encapsulate yellow quantum dots (QD encapsulate), and the encapsulation film layer proximal to the second base substrate is configured to encapsulate light-emitting units.

The display panel has substantially the same technical effects as the color film substrate described above, which are not repeated herein.

Figure 26:
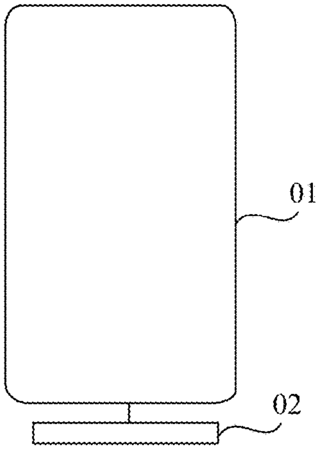
FIG. 26 is a schematic structural diagram of a display device according to some embodiments of the present disclosure.

FIG. 26 is a schematic structural diagram of a display device according to some embodiments of the present disclosure. Referring to FIG. 26, the display device includes a power supply assembly 02 and the display panel 01 as described above. The power supply assembly 02 is configured to power the display panel 01.

In some embodiments, the display device is a QD-OLED display device, an electronic paper, a cell phone, a tablet computer, a television, a monitor, a notebook computer, a digital photo frame, or a navigator, and any other product or component having a display function and a fingerprint identification function.

The display device has substantially the same technical effects as the color film substrate described above, which are not repeated herein.

The terms used in the detailed description of the present disclosure are merely for interpreting, instead of limiting, the embodiments of the present disclosure. It should be noted that unless otherwise defined, technical or scientific terms used in the embodiments of the present disclosure shall have ordinary meanings understandable by persons of ordinary skill in the art to which the disclosure belongs. The terms "first," "second," and the like used in the embodiments of the present disclosure are not intended to indicate any order, quantity, or importance, but are merely used to distinguish the different components. The terms “comprise,” “include,” and derivatives or variations thereof are used to indicate that the element or object preceding the terms covers the element or object following the terms and its equivalents, and shall not be understood as excluding other elements or objects. The terms “connect,” “contact,” and the like are not intended to be limited to physical or mechanical connections, but may include electrical connections, either direct or indirect connection. The terms “on,” “under,” “left,” and “right” are only used to indicate the relative positional relationship. When the absolute position of the described object changes, the relative positional relationship may change accordingly.

Described above are merely exemplary embodiments of the present disclosure, and are not intended to limit the present disclosure. Therefore, any modifications, equivalent substitutions, improvements, and the like made within the spirit and principles of the present disclosure shall be included in the protection scope of the present disclosure.

What is claimed is:

1. A display panel, comprising an array substrate and a color film substrate; wherein the array substrate comprises a plurality of light-emitting units, wherein light emitted from each of the light-emitting units is exited upon passing through the color film substrate, each of the light-emitting units in the array substrate emits blue light or a mixture of blue light and green light; and the color film substrate comprises: a first base substrate, comprising a plurality of first pixel regions, a plurality of second pixel regions, a plurality of third pixel regions, and a light-shielding region;

a plurality of control electrodes disposed on the first base substrate, wherein each of the control electrodes is within one of the third pixel regions and is supplied with a second signal of a same potential;

a color film layer disposed on the first base substrate, comprising at least a plurality of first color films, a plurality of second color films, and a plurality of color-changing color films, wherein an orthographic projection of each of the first color films on the first base substrate is within one of the first pixel regions, the first color film is in a first color, an orthographic projection of each of the second color films on the first base substrate is within one of the second pixel regions, the second color film is in a second color, and an orthographic projection of each of the color-changing color films on the first base substrate is within one of the third pixel regions, the color-changing color film is in a mixed color of the second color and a third color;

a drive circuit, connected to the plurality of color-changing color films, wherein each of the color-changing color films is configured to regulate a color ratio of the second color to the third color in the mixed color of the color-changing color film based on the second color and the third color under control of the second signal and the drive circuit; and a first light-shielding layer, disposed on the first base substrate, wherein an orthographic projection of the first light-shielding layer on the first base substrate is within the light-shielding region;

wherein the color film substrate further comprises a first color-converting layer, a second color-converting layer, a light-transmitting layer, and a second light-shielding layer; wherein the first color-converting layer comprises a first quantum dot, wherein the first quantum dot is excited based on light of the third color to emit light of the first color;

the second color-converting layer comprises a second quantum dot, wherein the second quantum dot is excited based on light of the third color to emit light of the second color;

the light-transmitting layer is configured to transmit light of the third color; and an orthographic projection of the second light-shielding layer on the first base substrate is within the light-shielding region;

and wherein the first color is red, the second color is green, and the third color is blue.

2. The display panel according to claim 1, wherein the first base substrate further comprises a plurality of fourth pixel regions, and the color film layer further comprises a plurality of third color films, wherein an orthographic projection of each of the third color films on the first base substrate is within one of the fourth pixel regions, and the third color film is in the third color.

3. The display panel according to claim 2, wherein a ratio of an area of the color-changing color film to a sum of areas of the color-changing color film and the third color film is positively correlated to a ratio of a peak energy of light of the third color to a peak energy of light of the second color in light emitted by the light-emitting unit in the array substrate of the display panel.

4. The display panel according to claim 1, wherein the first base substrate comprises a plurality of buffer empty pool region in one-to-one correspondence with the plurality of third pixel regions, and a communication hole is disposed in the first light-shielding layer between each of the buffer empty pool regions and a corresponding one of the third pixel regions; and the color-changing color film is acquired by curing a color-changing fluidic material, wherein prior to the curing, the color-changing fluidic material filled into each of the third pixel regions enters a corresponding one of the buffer empty pool regions through the communication hole; and upon the curing, the color-changing color film is within the third pixel region and the buffer empty pool region that are communicated.

5. The display panel according to claim 4, wherein each n buffer empty pool regions corresponding to each n third pixel regions of the plurality of third pixel regions are within a target region, each of the target regions being between two of the n third pixel regions; and a ratio of a sum of areas S2 of the n buffer empty pool regions to an area S1 of one of the third pixel regions satisfies:

$$S2/S1 \geq n\,(H1/H2-1);$$

wherein H1 represents a thickness of the color-changing fluid material in a case that the color-changing fluid material is filled only into the third pixel region, and H2 represents a thickness of the color-changing fluid material in a case that the color-changing fluid material is filled into both the third pixel region and the buffer empty pool region.

6. The display panel according to claim 5, wherein n is equal to 2, the target region is between two third pixel regions, each of the buffer empty pool regions is semicircular, straight edges of the two buffer empty pool regions within one of the target regions are opposite to each other, and the first light-shielding layer is disposed between the straight edges of two of the buffer empty pool regions.

7. The display panel according to claim 5, wherein n is equal to 6, six third pixel regions are arranged in three rows and two columns, the target region is between two of the third pixel regions in a second row, each of the buffer empty pool regions is equilateral triangle-shaped, vertex angles of the six buffer empty pool regions within one of the target regions are opposite to each other, and the first light-shielding layer is disposed between any two of the six buffer empty pool regions.

8. The display panel according to claim 1, wherein the color-changing color film is acquired by curing an electrochemical gel solution; and the color film substrate further comprises:

a plurality of first signal lines, wherein one end of each of the first signal lines is connected to one of the color-changing color films and the other end is connected to the drive circuit, the drive circuit supplies a first signal to the color-changing color film by the first signal line, and the first signals supplied by the drive circuit to different color-changing color films have different potentials; and a plurality of second signal lines, wherein one end of each of the second signal lines is connected to one of the control electrodes to supply the second signal to the control electrode by the second signal line;

wherein the color-changing color film is configured to regulate the color based on the second color and the third color under control of an electric field formed by a voltage difference between the first signal and the second signal.

9. The display panel according to claim 1, wherein the color-changing color film is acquired by curing a temperature gel solution; and the color film substrate further comprises:

a plurality of first signal lines, wherein one end of each of the first signal lines is connected to one of the color-changing color films and the other end is connected to the drive circuit, the drive circuit supplies a first signal to the color-changing color film by the first signal line, and the first signals supplied by the drive circuit to different color-changing color films have different potentials; and a plurality of second signal lines, wherein one end of each of the second signal lines is connected to one of the control electrodes, one end of the first signal line is further connected to one end of the second signal line, and the first signal supplied by the drive circuit for the color-changing color film is released to the control electrode by the second signal line;

wherein a temperature of the control electrode is positively correlated with a magnitude of a current of the signal transmitted over the first signal line and the second signal line, and the color-changing color film is configured to regulate the color based on the second color and the third color under control of the temperature of the control electrode.

10. The display panel according to claim 1, wherein the drive circuit comprises a first drive sub-circuit, a second drive sub-circuit, and a transistor device layer disposed on the first base substrate, the transistor device layer comprising a plurality of drive transistors; wherein each of the drive transistors comprises a control electrode, a first electrode, and a second electrode; wherein the control electrode is connected to the first drive sub-circuit and configured to turn on or turn off under control of the first drive sub-circuit, the first electrode is connected to the second drive sub-circuit and configured to receive a signal transmitted by the second drive sub-circuit, and the second electrode is connected to one of the color-changing color films and configured to supply, in response to the control electrode being turned on, the signal to one of the color-changing color films; or the drive circuit is a drive chip, wherein the drive chip is connected to the plurality of color-changing color films and configured to supply signals to the plurality of color-changing color films.

11. The display panel according to claim 1, wherein the array substrate and the color film substrate are opposite to form a cell; or the color film substrate is prepared directly on a side of the array substrate.

12. A display device, comprising: a power supply assembly and the display panel as defined in claim 1; wherein the power supply assembly is configured to power the display panel.

13. The display device according to claim 12, wherein the first base substrate further comprises a plurality of fourth pixel regions, and the color film layer further comprises a plurality of third color films, wherein an orthographic projection of each of the third color films on the first base substrate is within one of the fourth pixel regions, and the third color film is in the third color.

14. The display device according to claim 13, wherein a ratio of an area of the color-changing color film to a sum of areas of the color-changing color film and the third color film is positively correlated to a ratio of a peak energy of light of the third color to a peak energy of light of the second color in light emitted by the light-emitting unit in the array substrate of the display panel.

15. The display device according to claim 12, wherein the first base substrate comprises a plurality of buffer empty pool region in one-to-one correspondence with the plurality of third pixel regions, and a communication hole is disposed in the first light-shielding layer between each of the buffer empty pool regions and a corresponding one of the third pixel regions; and the color-changing color film is acquired by curing a color-changing fluidic material, wherein prior to the curing, the color-changing fluidic material filled into each of the third pixel regions enters a corresponding one of the buffer empty pool regions through the communication hole; and upon the curing, the color-changing color film is within the third pixel region and the buffer empty pool region that are communicated.

16. The display device according to claim 15, wherein each n buffer empty pool regions corresponding to each n third pixel regions of the plurality of third pixel regions are within a target region, each of the target regions being between two of the n third pixel regions; and a ratio of a sum of areas S2 of the n buffer empty pool regions to an area S1 of one of the third pixel regions satisfies:

$$S2/S1 \geq n\left(H1/H2 - 1\right);$$

wherein H1 represents a thickness of the color-changing fluid material in a case that the color-changing fluid material is filled only into the third pixel region, and H2 represents a thickness of the color-changing fluid material in a case that the color-changing fluid material is filled into both the third pixel region and the buffer empty pool region.

17. The display device according to claim 16, wherein n is equal to 2, the target region is between two third pixel regions, each of the buffer empty pool regions is semicircular, straight edges of the two buffer empty pool regions within one of the target regions are opposite to each other, and the first light-shielding layer is disposed between the straight edges of two of the buffer empty pool regions.

* * * * *